(12) United States Patent
Kim et al.

(10) Patent No.: US 10,254,333 B2
(45) Date of Patent: Apr. 9, 2019

(54) METHOD OF GENERATING QUALITY AFFECTING FACTOR FOR SEMICONDUCTOR MANUFACTURING PROCESS AND GENERATING SYSTEM FOR THE SAME

(71) Applicant: SAMSUNG ELECTRONICS CO., LTD., Suwon-si (KR)

(72) Inventors: SeungLi Kim, Seoul (KR); Bokyoung Kang, Hwaseong-si (KR); Ji-Youn Kwon, Seoul (KR); Gilhan Kim, Seoul (KR); Chanhun Park, Hwaseong-si (KR); Byonghun Cho, Hwaseong-si (KR); SeHoon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 364 days.

(21) Appl. No.: 14/955,633

(22) Filed: Dec. 1, 2015

(65) Prior Publication Data

US 2016/0202312 A1 Jul. 14, 2016

(30) Foreign Application Priority Data

Jan. 14, 2015 (KR) ........................ 10-2015-0006907

(51) Int. Cl.
  *G01R 31/26* (2014.01)
  *G01R 31/28* (2006.01)
  (Continued)

(52) U.S. Cl.
  CPC ......... *G01R 31/2894* (2013.01); *G01R 31/26* (2013.01); *G06Q 30/0282* (2013.01); *G06Q 50/04* (2013.01); *Y02P 90/30* (2015.11)

(58) Field of Classification Search
  CPC .... G01R 31/2894; G01R 31/28; G01R 31/26; G06Q 30/0282; G06Q 30/02;
  (Continued)

(56) References Cited

U.S. PATENT DOCUMENTS

| | | | |
|---|---|---|---|
| 6,954,907 B2 | 10/2005 | Nakano et al. | |
| 7,218,980 B1 | 5/2007 | Orshansky et al. | |
| 7,689,876 B2 | 3/2010 | Chung et al. | |
| 7,817,477 B2 | 10/2010 | Fujii | |

(Continued)

FOREIGN PATENT DOCUMENTS

| | | |
|---|---|---|
| JP | 7-307257 A | 11/1995 |
| JP | 2003-5997 A | 1/2003 |

(Continued)

OTHER PUBLICATIONS

Bieniek et al., Customer-Oriented Product Engineering of Micro and Nano Devices, Jun. 24-26, 2010, MIXDES 2010, 17th International Conference "Mixed Design of Integrated Circuits and Systems", Wroclaw, Poland, pp. 81-84.*
Tan et al., QFD Implementation in a Discrete Semiconductor Industry, 2002 IEEE, Proceedings Annual Reliability and Maintainability Symposium, pp. 484-489.*

(Continued)

*Primary Examiner* — Toan Le
(74) *Attorney, Agent, or Firm* — Sughrue Mion, PLLC (57) ABSTRACT

A quality affecting factor generation method for a semiconductor manufacturing process is provided. The method includes receiving data of a customer evaluation result obtained by a real use of shipped semiconductor products, preprocessing the data of the customer evaluation result, determining critical quality factors that affect a quality of the semiconductor products by applying a statistical model to the preprocessed data of the customer evaluation result; and determining a semiconductor product to be shipped to a (Continued)

customer company as a good product and a failed product using the determined critical quality factors and generating quality affecting factors of the semiconductor products to be managed to improve yield in a semiconductor manufacturing process.

20 Claims, 6 Drawing Sheets

(51) Int. Cl.
    *G06Q 30/02*     (2012.01)
    *G06Q 50/04*     (2012.01)

(58) Field of Classification Search
    CPC ......... G06Q 10/0639; G06Q 10/06395; G06Q 50/04; Y02P 90/03
    See application file for complete search history.

(56) References Cited

U.S. PATENT DOCUMENTS

| | | |
|---|---|---|
| 7,829,355 B2 | 11/2010 | Anzai |
| 2001/0044667 A1 | 11/2001 | Nakano et al. |
| 2008/0022167 A1 | 1/2008 | Chung et al. |
| 2008/0241968 A1 | 10/2008 | Fujii |
| 2009/0042322 A1 | 2/2009 | Anzai |

FOREIGN PATENT DOCUMENTS

| | | |
|---|---|---|
| JP | 2005-56907 A | 3/2005 |
| KR | 10-0696276 B1 | 3/2007 |

\* cited by examiner

METHOD OF GENERATING QUALITY AFFECTING FACTOR FOR SEMICONDUCTOR MANUFACTURING PROCESS AND GENERATING SYSTEM FOR THE SAME

CROSS-REFERENCE TO RELATED APPLICATIONS

This U.S. non-provisional patent application claims priority under 35 U.S.C. § 119 to Korean Patent Application No. 10-2015-0006907, filed on Jan. 14, 2015, the entire contents of which are hereby incorporated by reference.

BACKGROUND

1. Technical Field

Methods consistent with the present disclosure relate to a manufacturing process, and more particularly, to a method of generating a quality affecting factor for a semiconductor manufacturing process and a generating system for the same.

2. Description of the Related Art

A variety of integrated circuits are mounted on an electric device such as a computer, a smart phone, etc. After the integrated circuits are manufactured in a semiconductor manufacturing company, the integrated circuits may be shipped out to a customer as a semiconductor product.

A customer company can mount a volatile memory such as a DRAM or a nonvolatile memory such as a flash memory on a main board of an electronic device to perform various customer evaluation tests under the actual service environment of a semiconductor product.

A semiconductor manufacturing company can derive quality affecting factors affecting the quality of a semiconductor product on the basis of an internal evaluation result obtained by semiconductor manufacturing processes.

SUMMARY

According to an aspect of an exemplary embodiment, there is provided a quality affecting factor generation method for a semiconductor manufacturing process, the method comprising receiving data of a customer evaluation result obtained by a real use of shipped semiconductor products; preprocessing the data of the customer evaluation result to match the data of the customer evaluation result with manufacturing management evaluation data being managed for the semiconductor manufacturing process; determining critical quality factors that affect a quality of the semiconductor products by applying a statistical model to the preprocessed data of the customer evaluation result; and determining a semiconductor product to be shipped to a customer company as a good product and a failed product using the determined critical quality factors and generating quality affecting factors of the semiconductor products to be managed to improve yield in a semiconductor manufacturing process.

According to another aspect of an exemplary embodiment, there is provided a quality affecting factor generation method for a semiconductor manufacturing process, the method comprising receiving data of a customer evaluation result obtained by a real use of shipped semiconductor products, the customer evaluation result being related to generation of quality affecting factors of the shipped semiconductor products; preprocessing the data of customer evaluation result to match manufacturing management evaluation data being managed for the semiconductor manufacturing process; determining critical quality factors that affect quality of the shipped semiconductor products by applying a statistical model to the preprocessed data; dividing semiconductor products to be shipped to a customer company into a good product and a failed product using the determined critical quality factors; and generating quality affecting factors of the semiconductor products that are to be managed to improve a yield in the semiconductor manufacturing process by applying the divided semiconductor products to be shipped to a real customer company test environment to check the generated quality affecting factors with respect to the divided semiconductor products.

According to yet another aspect of an exemplary embodiment, there is provided a quality affecting factor generation method for a semiconductor manufacturing process. The quality affecting factor generation method may include a database which is connected to a data processing device of at least one customer company through a communication network and collects data of a customer evaluation result obtained by an actual use of the shipped semiconductor products and related to generation of quality affecting factors of the semiconductor products from the data processing device in real time, and a supplier server in line with the data base to generate the quality affecting factors. The supplier server comprises a preprocessing module performing a data preprocess so that the collected data of the customer evaluation result is matched with manufacturing management evaluation data being managed for a semiconductor manufacturing process, a first derivation module deriving important quality factors affecting quality of the semiconductor products by applying a statistical modeling to the preprocessed data, and a second derivation module estimating semiconductor products to be shipped to a customer company as a good product and a failed product under a customer service environment using the important quality factors derived from the first derivation module and deriving quality affecting factors of the semiconductor products that have to be managed to improve yield in a semiconductor manufacturing process.

According to yet another aspect of an exemplary embodiment, there is provided a method of generating quality affecting factors for a semiconductor manufacturing process, the method comprising performing an iterative feedback loop and controlling the semiconductor manufacturing process according to the determined quality affecting factors for the customer in order to increase a yield of the semiconductor manufacturing process for the customer. The performing the iterative feedback loop comprises receiving, from a customer, customer evaluation results obtained by testing shipped semiconductor products in customer products, the shipped semiconductor products being manufactured by the semiconductor manufacturing process; and determining quality affecting factors for the customer based on the received customer evaluation results, and shipping, to the customer, semiconductor products selected based on the determined quality affecting factors, for testing in the customer products.

BRIEF DESCRIPTION OF THE DRAWINGS

Exemplary embodiments will be described below in more detail with reference to the accompanying drawings, in which.

DETAILED DESCRIPTION OF EXEMPLARY EMBODIMENTS

Exemplary embodiments will be described more fully hereinafter with reference to the accompanying drawings, in which exemplary embodiments are shown. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Figure 1:
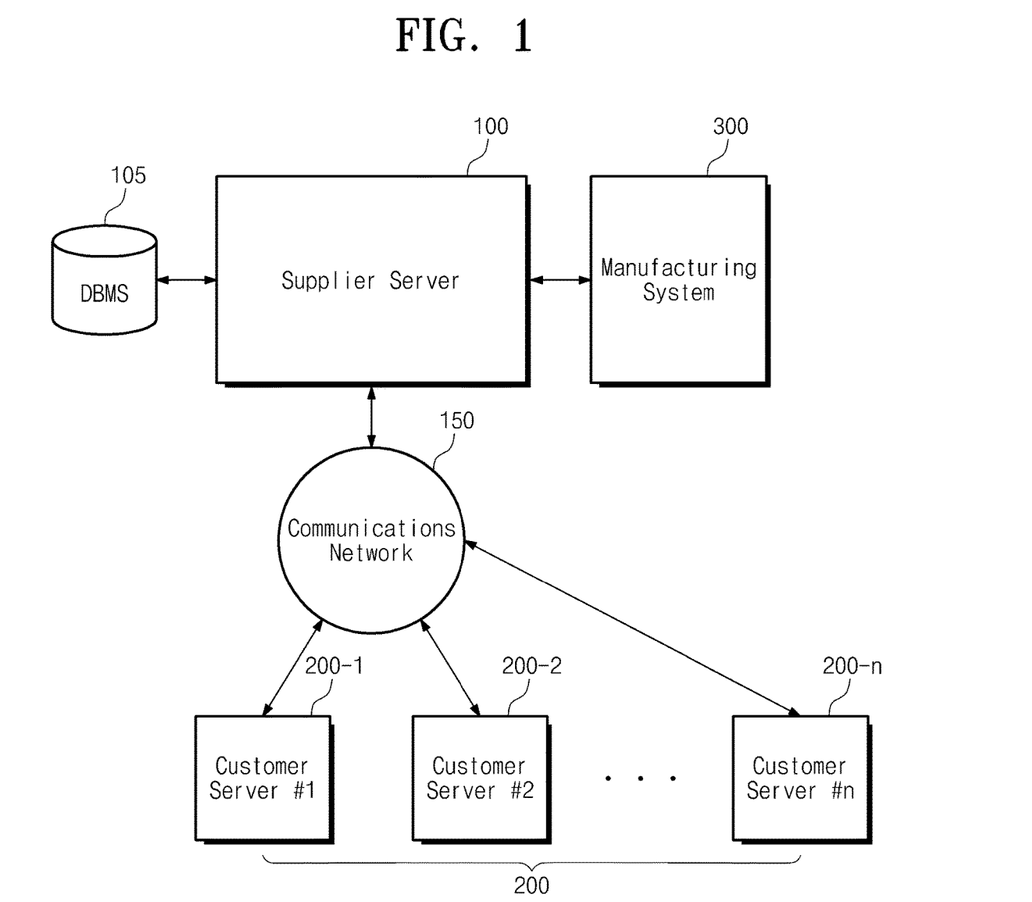
FIG. 1 is a block diagram illustrating a quality affecting factor generating system for a semiconductor manufacturing process in accordance with an exemplary embodiment.

FIG. 1 is a block diagram illustrating a quality affecting factor generating system for a semiconductor manufacturing process in accordance with an exemplary embodiment.

Referring to FIG. 1, the quality affecting factor generating system may include a supplier server 100 communicatively connected to customer server group 200 through a communication network 150. The communicative connection may be by wire or may be wireless, as discussed further below.

The customer server group 200 may include a plurality of customer servers 200-1, 200-2, . . . , 200-n. A customer server 200-1 that functions as a data processing device at customer company side performs a mounting test on semiconductor products that were shipped to the customer by the supplier to generate data of a customer evaluation result related to a generation of quality affecting factors of the semiconductor products. The data of a customer evaluation result may include, but is not limited to, a test condition in a mounting test, test device information used in the mounting test and defective item information of the semiconductor products. For example, the supplier may ship a semiconductor device to the customer. At the customer, the customer may mount the semiconductor device in a customer product such as an electronic device (e.g., a computer, a smart phone, etc.) and perform tests on the electronic device and on the received semiconductor device under certain test conditions. The customer may provide information on the test conditions, the electronic device that the semiconductor device is mounted in, the test setup, and the results of the test, including data on any defective semiconductor device, to the supplier for the supplier to use in improving its manufacturing processes. The results form a customer evaluation result. Alternatively or additionally, the customer may mount the semiconductor device in a mounting fixture separate from the electronic device, and may perform tests on the semiconductor in the mounting fixture under certain test conditions, and may provide information on the mounting fixture, the test conditions, the test setup, and the results of the test, including data on any defective semiconductor device, to the supplier for the supplier to use in improving its manufacturing processes.

The supplier server 100 may be communicatively connected to a database management system 105 to store and update data of the customer evaluation results and manufacturing managing evaluation data being managed for a semiconductor manufacturing process. The inventive concept is not limited thereto and the supplier server 100 may have a database autonomously without being connected to the data base management system 105.

The communication network 150 may be a local area network (LAN), a metropolitan area network (MAN), a wide area network (WAN), a value added network (VAN), an integrated service digital network (ISDN) or a broadband ISDN (B-ISDN). The inventive concept is not limited thereto and the communication network 150 may be a wireless communication network.

The supplier server 100 receives data of a customer evaluation result obtained by an actual use of the shipped semiconductor products through the communication network 150. The data of a customer evaluation result may be stored and updated in a database in real time. The customer evaluation result is related to the generation of quality affecting factors of the semiconductor products, and may be used, in part, to generate the quality affecting factors, as will be described below.

The supplier server 100 may generate the quality affecting factors in line with the data stored in the database.

The supplier server 100 may include a preprocessing module and first and second derivation modules. The preprocessing module and the first and second derivation module may be embodied in the form of software, hardware or a combinations thereof.

The preprocessing module may perform preprocessing of the data received from the customer so that collected data of the customer evaluation result matches with manufacturing managing evaluation data being managed for a semiconductor manufacturing process. That is, for example, the preprocessing module may preprocess the data received from the customer to put the data in a format to match the format of the supplier's systems.

The first derivation module may derive critical quality factors affecting the quality of the semiconductor products by applying statistical modeling to the preprocessed data. That is, the first derivation module may determine critical quality factors specific to each customer based on the preprocessed data.

The second derivation module may estimate semiconductor products to be shipped to the customer company as good products and/or failed products under the customer company service environment using the critical quality factors derived from the first derivation module, and drive the quality affecting factors of the semiconductor products to manage the quality affecting factors to improve yield in a semiconductor manufacturing process. That is, the second derivation module may estimate which supplier products meet or do not meet with critical quality factors for each customer, and use the critical quality factors to manage the quality affecting factors on the supplier-side so that the supplier may improve its manufacturing process.

The supplier server 100 may provide the generated quality affecting factors to the manufacturing system 300 controlling a semiconductor manufacturing process. The manufacturing system 300 may control parameters of the manufacturing process on the basis of the quality affecting factors.

The supplier server 100 may provide the generated quality affecting factors to the customer servers 200-1, 200-2, ..., 200-n through the communicate network 150. The quality affecting factors provided to the customer servers 200-1, 200-2, ..., 200-n may be reflected in the tests on the semiconductor devices used by the customer, for example, the tests on the electronic device and/or the tests on the semiconductor device using the mounting fixture described above.

The supplier server 100 is aligned and linked with the customer server group 200 in real time to reflect data of a customer evaluation result in an analysis of quality affecting factors in real time. That is, the supplier server 100 and the customer server group 200 exchange data in real time and provide a real-time feedback loop for both the supplier and customer to improve their respective processes.

The supplier server 100 and the customer servers 200-1, 200-2, ..., 200-n inside the customer server group 200 may each include a processor, a main memory, a read only memory (ROM), a storage device, an input device, an output device, and/or a communication interface that are communicatively connected to one another through a bus.

The processor may include a process, a microprocessor and/or a processing logic that can analyze and execute a command. The processor may include a plurality of microprocessors arranged in a distributed or parallel processing configuration.

The main memory may include a random access memory (RAM) that may store information or a command for execution by the processor, or may include a different type of dynamic storage device or a nonvolatile memory such as a PRAM, a MRAM, etc.

The ROM may include a ROM device that stores static information and commands being used by the processor, and/or may include a different type of static storage device.

The storage device may include SSD, a magnetic recording medium, an optical recording medium, and/or a driver corresponding thereto.

According to a configuration of FIG. 1, since when a quality affecting factor is generated, data of a customer evaluation result is reflected in real time, manufacturing yield of a semiconductor manufacturing company may be improved and a reliability of semiconductor products may be increased for a customer.

When a quality affecting factor is generated, if a customer evaluation result is not reflected or is reflected several days late or several tens of days late, effectiveness or reliability of the semiconductor product with respect to the derived quality affecting factor may be degraded.

Figure 2:
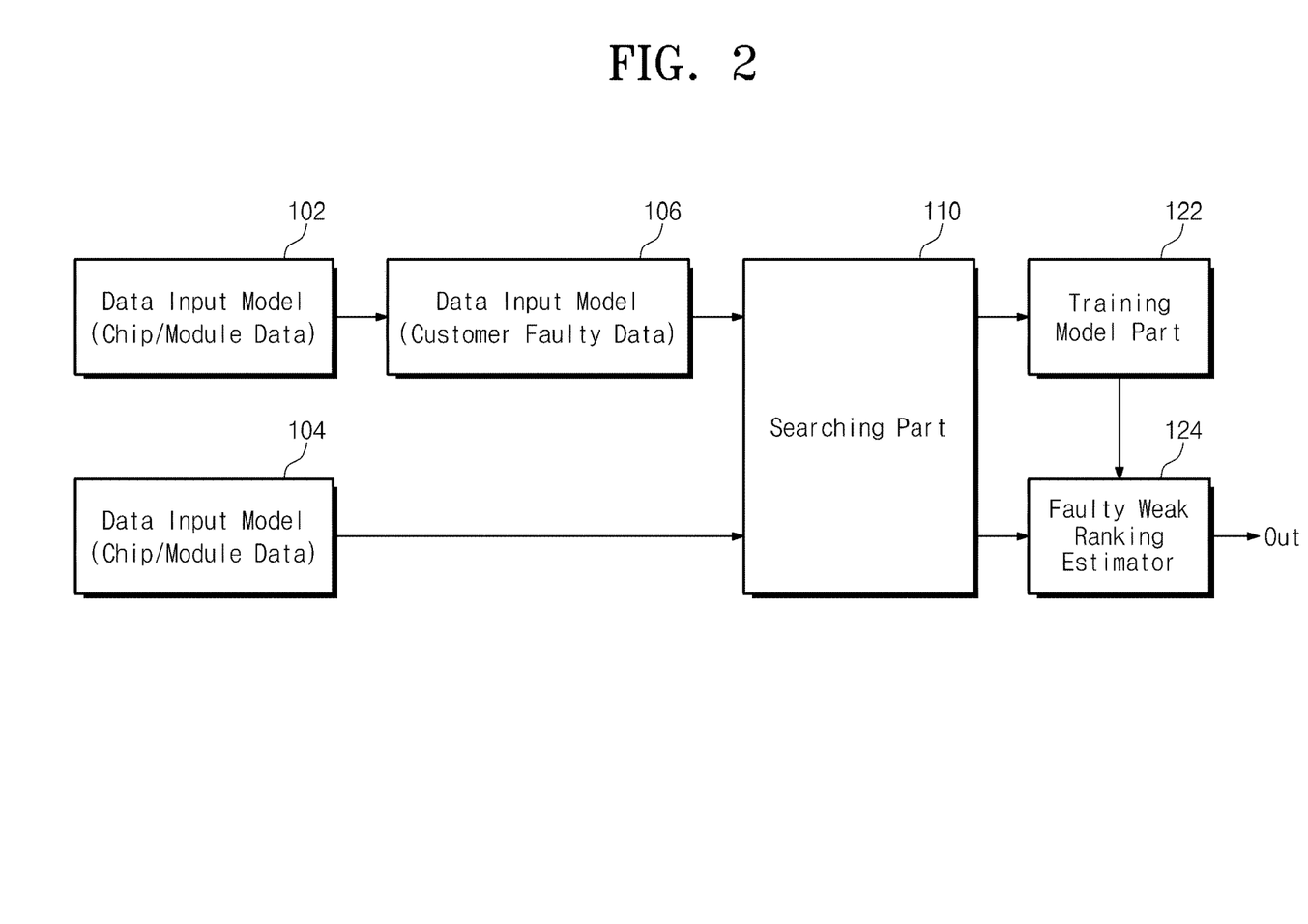
FIG. 2 is a block diagram illustrating functional modules in a supplier server of FIG. 1, according to an exemplary embodiment.

FIG. 2 is a block diagram illustrating functional modules in a supplier server of FIG. 1, according to an exemplary embodiment.

Referring to FIG. 2, functional modules of the supplier sever 100 may include data input modules 102, 104 and 106, a searching part 110, a training model part 122 and a faulty weak ranking estimator 124.

The data input module 102 provides manufacturing management evaluation data with respect to a shipped semiconductor product. In this case, the manufacturing management evaluation data may be divided according to the form of the semiconductor product. For example, the manufacturing management evaluation data may be divided at the module, package (chip), or wafer level of the semiconductor products.

The data input module 104 provides manufacturing management evaluation data with respect to a semiconductor product to be shipped. Similarly, the manufacturing management evaluation data may be divided according to the form of the semiconductor product. For example, the manufacturing management evaluation data may be divided at the module, package (chip), or wafer level of the semiconductor products.

The data input module 106 provides customer faulty data with respect to a shipped semiconductor product. The customer faulty data may be obtained from data of a customer evaluation result. As described in detail above, the data of the customer evaluation result may include a test condition in a mounting test, test device information used in the test and defective item information of the semiconductor products.

The searching part 110 performs a function of a preprocessing module performing preprocessing of data so that the collected data of the customer evaluation result matches with manufacturing managing evaluation data being managed for a semiconductor manufacturing process, and a function of the first derivation module deriving critical quality factors affecting quality of the semiconductor products by applying a statistical modeling to the preprocessed data.

The training model part 122 establishes a training model about a corresponding semiconductor product by making use of critical quality factors being provided from the searching part 110.

The faulty weak ranking estimator 124 determines semiconductor products to be shipped to the customer company as good product and failed product under the customer company service environment using the critical quality factors derived from the first derivation module, and performs a function of the second derivation module deriving the quality affecting factors of the semiconductor products that have to be managed to improve yield in a semiconductor manufacturing process. Thus, the faulty weak ranking estimator 124 may determine a faulty weak ranking for various modules of a semiconductor product being shipped. That is, the faulty weak ranking estimator 124 may determine a faulty weak ranking for the semiconductor products on a module, package (chip), or wafer level.

The searching part 110 can derive the critical quality factors for establishing a training model on the basis of a stepwise feature selection and a k (k is a natural number) fold cross validation.

A training dataset may be constituted by $\{x1, \ldots, xn\}$ which is a chip/module-level test item value of a past shipping module and data (for example, pass/fail data) of a customer evaluation result collected from a customer company.

A stepwise feature selection+K-fold cross validation logic may be used to search a combination of factors (for example, a test item) that can accomplish robustness and estimation accuracy at the same time.

As a result of using the stepwise feature selection+K-fold cross validation, a logistic regression-based training model may be established. If a chip/module test item value of a supply to be shipped is input to a corresponding model, a faulty weak ranking by a shipping module may be estimated by the faulty weak ranking estimator 124. An adaptive test by group of a customer company may be divided into a strong group and a weak group to be performed.

Figure 3:
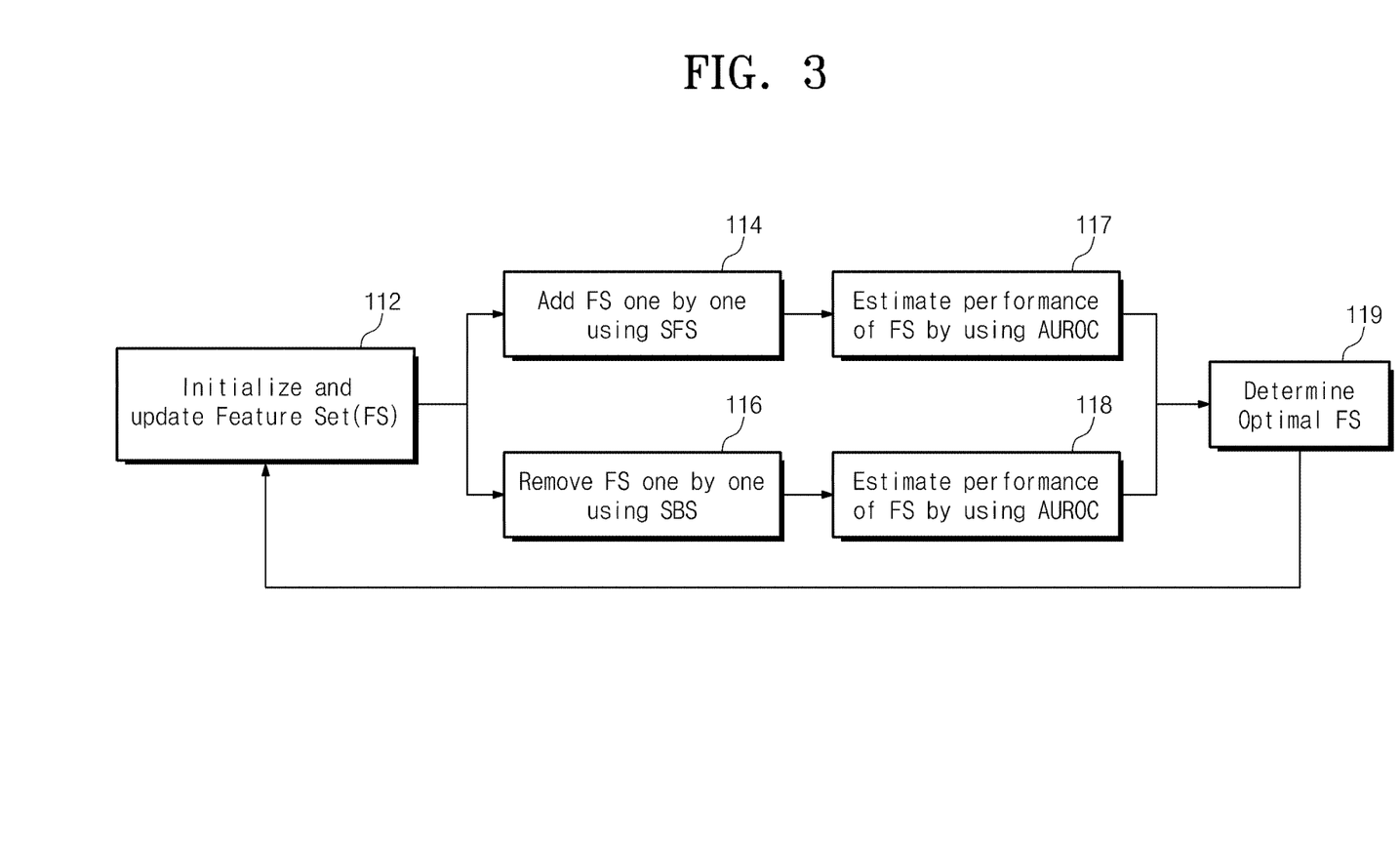
FIG. 3 is a block diagram illustrating a search performing flow of a searching part of the function modules of FIG. 2, according to an exemplary embodiment.

FIG. 3 is a block diagram illustrating a search performing flow of the searching part of FIG. 2.

Referring to FIG. 3, the search performing begins from an operation 112 of initializing and updating a feature set (FS) of quality affecting factors and may transition to an operation 114 of adding factors of the feature set one by one using a sequential forward selection (SFS) or an operation 116 of removing factors of the feature set one by one using a sequential backward selection (SBS).

The SFS denotes adding each factor of a candidate set to a selection set one by one to search for an additional factor having the greatest accuracy improvement, and the SBS denotes removing each factor of the selection set one by one to search for a removal factor having the greatest accuracy improvement.

The stepwise feature selection may denote performing both of the sequential forward selection (SFS) and the sequential backward selection (SBS) in parallel.

After the operation 114 is performed, an operation 117 of estimating performance of a feature set to which factors are added using an area receiver operating characteristic (AUROC) may be performed.

After operation 116 is performed, an operation 118 of estimating performance of a feature set from which factors are removed using an area receiver operating characteristic (AUROC) may be performed.

After one of the operations 117 and 118 is performed, an operation 119 of determining an optimal feature set (FS) may be performed.

The operations 117 and 118 are operations of quantitatively evaluating performance of a learned feature set by learning a logistic regression model targeting a feature set (a new feature set to which factors are added or from which factors are removed) of each evaluation target. A k-fold cross validation may be used in the quantitative evaluation. Herein, k is a natural number. The given training dataset, that is, the feature set, is divided into k number equal groups and a model learned to data of k−1 number of groups may be applied to data of the remaining one group. That procedure may be repeated up to k times (k is a natural which is two or more).

An evaluation standard may be determined by an area receiver operating characteristic (AUROC) through a matching between a logistic regression score (a value between 0 and 1, and a probability that a target value becomes 1) and whether products tested by an actual customer company are passed or failed. A procedure of searching a new feature set having a higher AUROC average through the k-fold cross validation compared with a current feature set and a logistic regression model may be repeated until accuracy is no longer improved.

A statistical model that is used may be generated by using other conventional statistical techniques instead of the logistic regression or in addition to the logistic regression. For example, in some exemplary embodiments, the statistical model may be generated by using a "stump" using a "boosting" technique. The boosting technique is a machine learning technique that establishes a statistical model by continuously improving another weak statistical model. A basic concept is to repeatedly apply the same algorithm to the whole training data set but the weighting is assigned to the training data differently at every stage. In the case that the model is well-fit until the stage k, relatively small weighting is assigned to a stage K+1, and in the case that the model is ill-fit until the stage k, relatively large weighting is assigned to a stage K+1.

Figure 4:
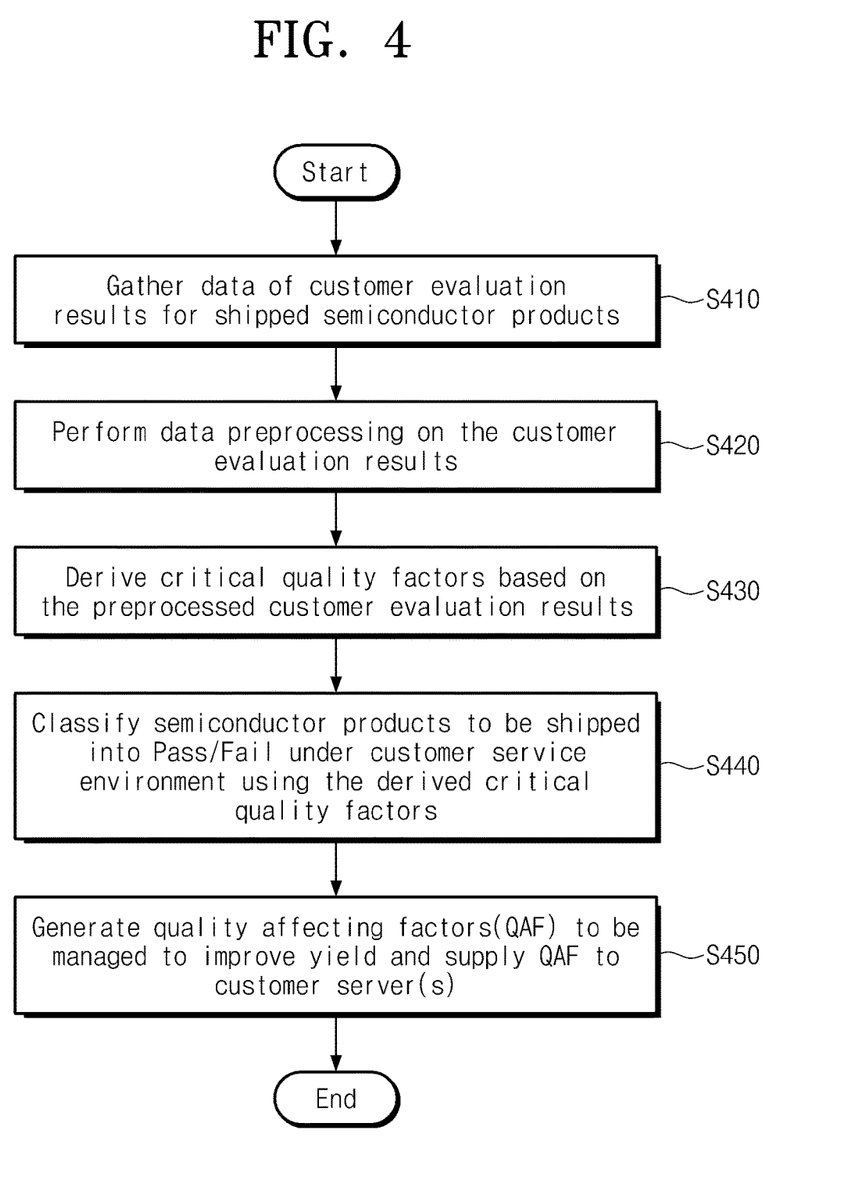
FIG. 4 is a flow chart of a quality affecting factor generation method according to an exemplary embodiment.

FIG. 4 is a flow chart of a quality affecting factor generation according to FIG. 1.

Referring to FIG. 4, in an operation S410, the supplier server 100 collects data of a customer evaluation result obtained by actually using shipped semiconductor products through the communication network 150 in real time. The customer evaluation result data is related to a generation of quality affecting factors of the semiconductor products. The data of the customer evaluation result may be provided from one or more of the customer servers 200-1, 200-2, . . . , 200-n of at least one customer company that purchased the semiconductor products. The data of the customer evaluation result may include a test condition used in the test, test device information used in the test, and/or defective item information of the semiconductor products according to a wafer level, a package level, and/or a module level of the semiconductor products, as described earlier.

In an operation S420, the supplier server 100 performs data preprocessing so that the collected data of the customer evaluation result matches with manufacturing management evaluation data being managed for a semiconductor manufacturing process. That is, the data preprocessing changes the collected data into, for example, a format that is compatible with the manufacturing management evaluation data on the supplier side.

In an operation S430, the supplier server 100 derives critical quality factors that affect the quality of semiconductor products by applying a statistical model to the preprocessed data. The derivation of the critical quality factors may include a feature set search operation based on a stepwise feature selection executing a sequential forward selection (SFS) and a sequential backward selection (SBS) in parallel, as described above. The derivation of the critical quality factors may also include a feature set search operation based on a test result obtained by adding a k-fold cross validation (k is a natural number) to the stepwise feature selection. The test result becomes the AUROC of a logistic regression model learned to a feature set and is calculated as a value averaged k times through the k-fold cross validation.

In an operation S440, the supplier server 100 classifies semiconductor products to be shipped to a customer company into good products and failed products under the customer service environment using the derived critical quality factors. That is, the supplier server 100 classifies the semiconductor products to be shipped as passing or failing under the customer service environment of the customer to which the products will be shipped, using the derived critical quality factors for the customer.

In an operation S450, the supplier server 100 generates quality affecting factors (QAF) (i.e., quality factors that affect the semiconductor products) of the semiconductor products that have to be managed to improve yield in a semiconductor manufacturing process of a semiconductor company, and supplies the generated quality affecting factors (QAF) to customer server(s). The quality affecting factors (QAFs) may be generated by directly applying the classified semiconductor products to be shipped to an actual customer company test environment to check actual quality affecting factors with respect to the semiconductor products.

The generated quality affecting factors may be provided to the manufacturing system 300 controlling a semiconductor manufacturing process to control the semiconductor manufacturing process.

The generated quality affecting factors may also be provided to at least one customer server of a customer company.

A semiconductor product having stable quality affecting factors can bring not only test time reduction to a customer company but also manufacturing yield improvement to a semiconductor manufacturing company. Thus, a test cost reduction and a stable product production may be guaranteed.

Figure 5:
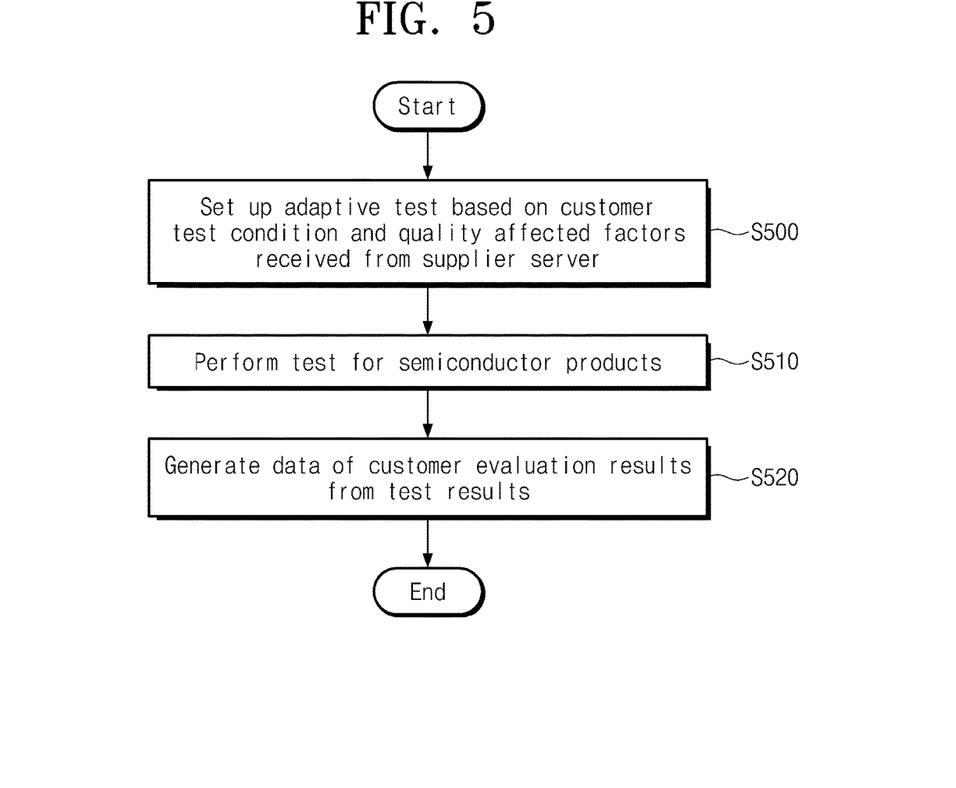
FIG. 5 is a flow chart of data generation method with respect to a customer evaluation result of a customer server, according to an exemplary embodiment.

FIG. 5 is a flow chart of a data generation method with respect to a customer evaluation result of a customer server, according to an exemplary embodiment.

Referring to FIG. 5, in an operation S500, the customer server sets up an adaptive test based on a customer test condition and quality affecting factors of a semiconductor product received from the supplier server 100.

In an operation S510, one or more customer servers 200-1, 200-2, ..., 200-n performs a test on a shipped semiconductor product, and/or on an electronic device that includes the shipped semiconductor product, as described above. The test may be performed by applying a specific signal pattern to a semiconductor product using an automatic test equipment (ATE) and analyzing a signal being output from the semiconductor product. The test determines whether the semiconductor product is faulty or not by analyzing the signal being output from the semiconductor product.

An example of the test in which the semiconductor is a DRAM will now be described. As a semiconductor product becomes high capacity and high speed and thereby a cost for testing a semiconductor product becomes high, the test may be performed using a main board called a motherboard. The test may be performed by inserting a DRAM module being used in a personal computer into the main board to drive a test program according to an actual environment. In this case, if a personal computer normally operates with the inserted DRAM module, the DRAM module is determined to be normal and if the personal computer abnormally operates with the inserted DRAM module, the DRAM module is determined to be faulty.

The test may include an operation of writing write data in a memory cell of the DRAM and reading the written data to the outside of the DRAM after mounting a DRAM module in a slot of the mother board. In this case, a test temperature and a test power supply are set and in the case that a read operation of the DRAM is successfully performed, the corresponding DRAM module is determined to pass. On the other hand, in the case that the read operation of the DRAM is not successfully performed, the corresponding DRAM module is determined to fail. While a DRAM is described, it will be understood that the type of semiconductor product is not particularly limited, and other types of semiconductor products are contemplated.

In the case of a memory module, a RANK parallel test board (PTB) technology may be used to increase test efficiency of a mounting test system.

The RANK PTB technology is, in the case that memory modules have two or more ranks, a technology of recognizing the memory modules as having one rank to test the memory modules. If testing memory modules using the RANK PTB technology, a bus for a chip selection signal connected to a first bank is electrically connected to a bus for a chip selection signal connected to a second bank. To realize the RANK PTB, an option is set up in a BIOS of a computer. If using an unused pin (e.g., a NC PIN) of an input/output control circuit, one of a normal mode and a RANK PTB mode may be selected. If the RANK PTB mode is selected, in the case that memory modules have two or more ranks, the memory modules are recognized as having one rank to be tested. Thus, in the case of the RANK PTB mode, test time may be reduced by half compared with the normal mode.

In an operation S520, the one or more customer server 200-1, 200-2, ..., 200-n generates data of a customer evaluation result according to the test result. In this case, the data of the customer evaluation result may be provided as a data list illustrated in FIG. 6.

The data of the customer evaluation result is transmitted to the supplier server 100 in real time through the communication network 150.

Figure 6:
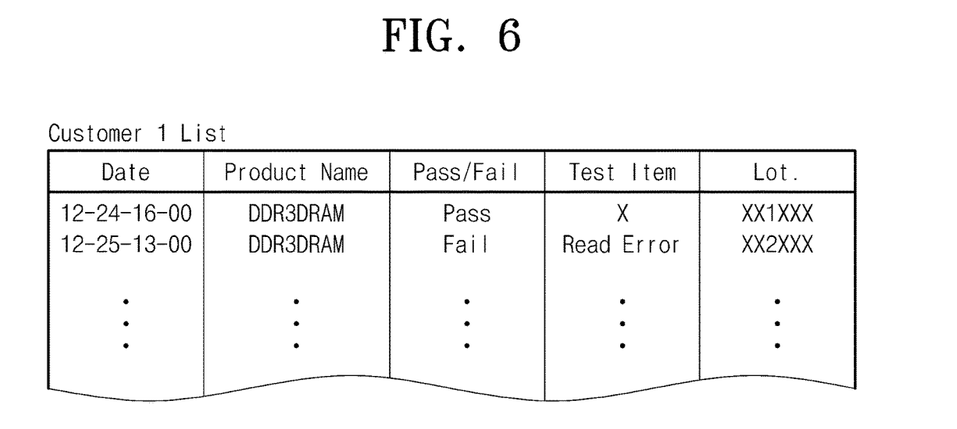
FIG. 6 is an example of a customer evaluation result list generated according to the data generation method of FIG. 5, according to an exemplary embodiment.

FIG. 6 is an example of a customer evaluation result list generated according to the data generation of FIG. 5, according to an exemplary embodiment.

Referring to FIG. 6, the customer evaluation result list may include information of a test date and time, a semiconductor product name, information indicating a pass/fail representing whether the semiconductor product failed or not, a test item, and/or a lot number. In addition, the customer evaluation result list may include a test condition of test on the semiconductor products, information of a test device used in the test, and/or defective item information of the semiconductor products.

For example, as illustrated in the example of FIG. 6, a DDR3 DRAM is failed in a test performed at 13:00 on December 25 and a cause of a failure shown in the test item is a read error.

A cause of a read error may be a failure in a power supply caused by a disconnection or short of a power supply line, a package failure, a data retention failure of a memory cell that exists in a memory cell array, etc.

Although a DRAM was described in FIG. 6 as an illustration, a volatile memory device such as a static RAM (SRAM), a synchronous DRAM (SDRAM), etc. and a nonvolatile memory device such as a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (ReRAM), a ferroelectric RAM (ReRAM), etc. may be tested under the set condition and a pass/fail result may be obtained. While different types of memories are described, this is only an example, and other types of semiconductor products may be tested.

The data of the customer evaluation result generated like FIG. 6 is collected in real time and may be reflected in real time when generating a quality affecting factor (QAF) used for a semiconductor manufacturing process. Thus, a manufacturing yield of a semiconductor manufacturing company may be improved and reliability of shipped semiconductor products may be increased.

Figure 7:
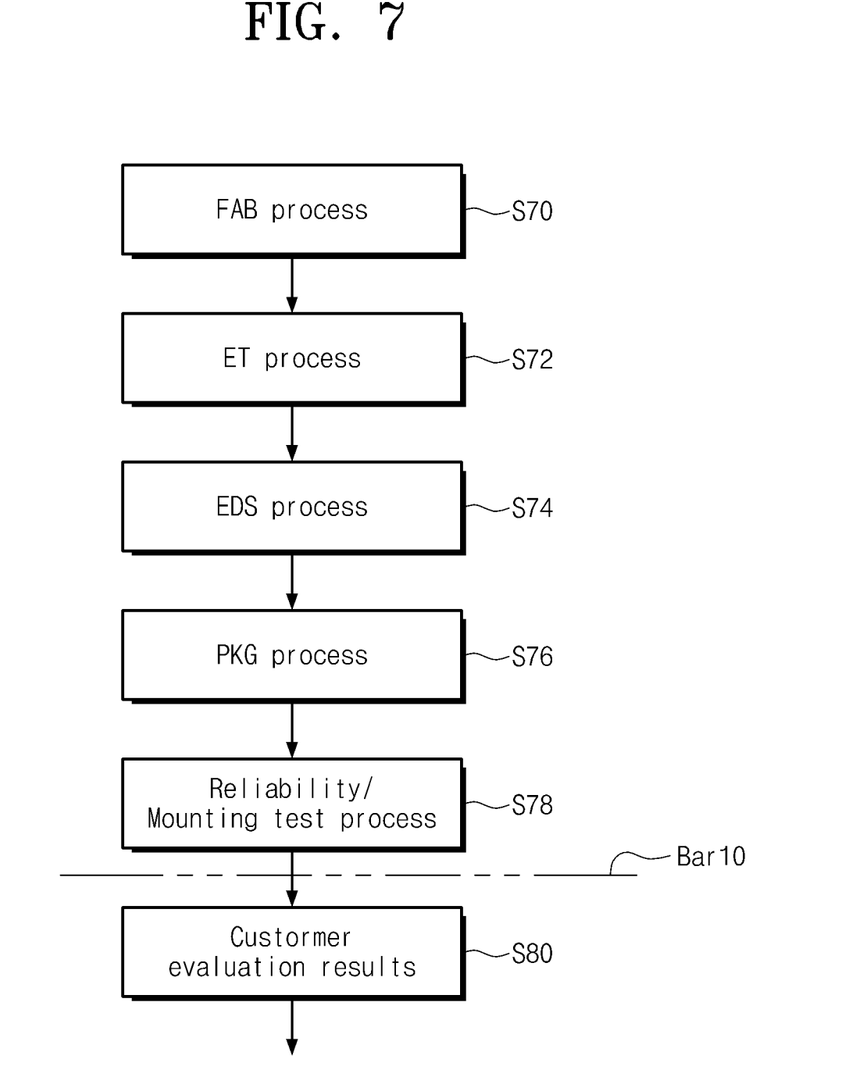
FIG. 7 is a block diagram illustrating a semiconductor manufacturing process and a customer evaluation result that are applied to the inventive concept.

FIG. 7 is a block diagram illustrating a semiconductor manufacturing process and a customer evaluation result that are applied to the inventive concept, according to an exemplary embodiment. In some exemplary embodiments, the semiconductor manufacturing process may proceed sequentially through the operations shown in FIG. 7.

Referring to FIG. 7, a FAB process S70 may include a unit process such as a photolithography process, an etch process, an ion implantation process, a thin film process, a CMP process, etc. that are basically performed in a manufacturing line.

An ET process S72 denotes a process in which an electrical test is performed. An AC parameter test or a DC parameter test may be included in the ET process S72.

Semiconductor products may be tested for several factors. For example, in the case of a semiconductor chip, a memory cell may be normally operated in the case that a defect does not exist in various factors such as a quality (for example, a thickness of an information storage layer) of a memory factor, a stability (for example, interconnection-via contact characteristic) of electrical connection structure of the memory cell, and/or a stability (for example, bridge between interconnections) of electrical separation between interconnections connecting the memory cells. Thus, each test item with respect to the semiconductor memory chip may be configured to quantitatively evaluate those factors.

An EDS process S74 denotes an electric die sorting process. Semiconductor chips on a wafer are divided into a good chip and a failed chip by a result of the EDS test. The failed chip may be divided into a chip capable of being corrected by a redundancy process and a chip incapable of being corrected by a redundancy process again.

If a test program in the EDS process S74 is strengthened, a test time of a semiconductor product increases. In some cases, an overkill phenomenon may occur. The overkill phenomenon is that an available semiconductor product is determined to be failed due to the strengthened test program. Thus, productivity may become low in an electrical test process of a semiconductor product due to the increased test time, and yield may become low due to the overkill. In some exemplary embodiments, data of customer evaluation result may be reflected to the EDS process S74 in real time. Thus, in the EDS process S74, a test program may be eased within a range such that an overkill phenomenon does not occur.

A PKG process S76 denotes a process for packaging a chip to protect the chip from an external environment.

A reliability/mounting test process S78 denotes a process of reliability/mounting test process being performed in a semiconductor manufacturing company.

A customer evaluation result process S80 shown below a bar 10 denotes a process being mounting-tested by a customer company after a semiconductor product is shipped.

To improve yield or reliability, data of the customer evaluation result being derived from the customer evaluation result process S80 may be reflected in quality affecting factors of semiconductor products being managed when the processes S70, S72, S74, S76 and S78 in a semiconductor manufacturing process are in process.

In the case of understanding a quality affecting factor under the real customer service environment and discovering a quality improvement point through the derived affected factors, yield improvement of semiconductor product and quality improvement under the actual service environment may be achieved.

According to exemplary embodiments, a shipment of a product in which a defect is likely to occur may be prevented in advance by deriving quality affecting factors having an important influence on quality at a customer company side. Thus, a failure return rate of products from a customer company may be greatly reduced.

By collecting customer information in advance, not only detecting or preventing a customer quality accident at an early stage but also quality reinforcement of a semiconductor product and a cost reduction of a customer quality management may be obtained. Customer reliability may increase.

According to exemplary embodiments, since data of a customer evaluation result is reflected in real time when a quality affecting factor is generated, manufacturing yield of a semiconductor manufacturing company is improved and customer reliability with respect to semiconductor products increases.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. The present inventive concept is defined by the following claims, with equivalents of the claims to be included therein.

What is claimed is:

1. A method for a semiconductor manufacturing process, the method comprising:
    shipping semiconductor products that have been manufactured by the semiconductor manufacturing process;
    receiving data of a customer evaluation result obtained by a real use of customer products in which the semiconductor products that have been shipped have been implemented;
    preprocessing the customer evaluation data to match the customer evaluation data with manufacturing management evaluation data being managed for the semiconductor manufacturing process;
    determining critical quality factors that affect a quality of the semiconductor products by applying a statistical model to the customer evaluation data that has been preprocessed; and
    determining a semiconductor product to be shipped to a customer company as a good product and a failed product using the critical quality factors that have been determined and generating quality affecting factors of the semiconductor products to be managed, and controlling the semiconductor manufacturing process according to the quality affecting factors that have been generated, to improve yield in the semiconductor manufacturing process,
    wherein the data includes a test condition related to a test of the semiconductor products that have been shipped, information of a test device used in the test, and defective item information of the semiconductor products that have been tested.

2. The method of claim 1, wherein the data is received from at least one customer company that is using the semiconductor products that have been shipped.

3. The method of claim 1, wherein the preprocessing comprises matching a form of the data to a form of the manufacturing management evaluation data.

4. The method of claim 3, wherein the form comprises at least one of a module, a package and a wafer level.

5. The method of claim 1, wherein the determining the critical quality factors comprises a feature set search operation based on a stepwise feature selection.

6. The method of claim 5, wherein the stepwise feature selection comprises executing a sequential forward selection and a sequential backward selection in parallel.

7. The method of claim 5, wherein the determining the critical quality factors further comprises a feature set search operation based on a test result obtained by adding k fold cross validation to the stepwise feature selection, where k is a natural number.

8. The method of claim 1, further comprising providing the quality affecting factors that have been generated to a manufacturing system that controls the semiconductor manufacturing process.

9. The method of claim 1, wherein the quality affecting factors that have been generated are transmitted to at least one customer server.

10. A method for a semiconductor manufacturing process, the method comprising:

shipping semiconductor products that have been manufactured by the semiconductor manufacturing process;

receiving data of a customer evaluation result obtained by a real use of customer products in which the semiconductor products that have been shipped have been implemented, the customer evaluation result being related to generation of quality affecting factors of the semiconductor products that have been shipped;

preprocessing the customer evaluation data to match manufacturing management evaluation data being managed for the semiconductor manufacturing process;

determining critical quality factors that affect quality of the semiconductor products that have been shipped, by applying a statistical model to the customer evaluation data that has been preprocessed;

dividing semiconductor products to be shipped to a customer company into a good product and a failed product using the critical quality factors that have been determined; and generating quality affecting factors of the semiconductor products that are to be managed and controlling the semiconductor manufacturing process to improve a yield in the semiconductor manufacturing process by applying the semiconductor products to be shipped that have been divided, to a real customer company test environment to check the quality affecting factors that have been generated, with respect to the semiconductor products that have been divided, wherein the data comprises a test condition related to a test of the semiconductor products that have been shipped, information of a test device used in the test, and defective item information of the semiconductor products that have been tested, according to a wafer level, a package level and a module level of the semiconductor products.

11. The method of claim 10, wherein the data is received from a customer server of at least one customer company that purchased the semiconductor products that have been shipped.

12. The method of claim 10, wherein the determining the critical quality factors comprises a feature set search operation based on a stepwise feature selection that executes a sequential forward selection and a sequential backward selection in parallel.

13. The method of claim 10, wherein the determining the critical quality factors further comprises a feature set search operation based on a test result obtained by adding k fold cross validation to a stepwise feature selection, where k is a natural number.

14. The method of claim 10, wherein the quality affecting factors that have been generated are transmitted to at least one customer server.

15. The method of claim 10, further comprising:

a data base which is connected to a data processing device of at least one customer company through a communication network and collects data of a customer evaluation result obtained by an actual use of the shipped semiconductor products and related to generation of quality affected factors of the semiconductor products from the data processing device in real time; and a supplier server in line with the data base to generate the quality affected factors.

16. A method for a semiconductor manufacturing process, the method comprising:

shipping semiconductor products that have been manufactured by the semiconductor manufacturing process;

performing an iterative feedback loop comprising:

receiving, from a customer, customer evaluation results obtained by testing the semiconductor products that have been shipped in customer products in which the semiconductor products have been implemented;

determining quality affecting factors of the semiconductor products for the customer based on the customer evaluation results that have been received, and shipping, to the customer, semiconductor products selected based on the quality affecting factors that have been determined, for testing in the customer products; and controlling the semiconductor manufacturing process according to the quality affecting factors that have been determined for the customer in order to increase a yield of the semiconductor manufacturing process for the customer, wherein the customer evaluation results include a test condition related to a test used in testing the semiconductor products that have been shipped, information of a test device used in the test, and defective item information of the semiconductor products that have been tested.

17. The method of claim 16, wherein the determining the quality affecting factors comprises:

preprocessing the customer evaluation results to match manufacturing management evaluation data being managed for the semiconductor manufacturing process;

determining critical quality factors that affect quality of the semiconductor products that have been shipped, by applying a statistical model to the customer evaluation results that have been preprocessed;

dividing semiconductor products to be shipped to the customer into a good product and a failed product using the critical quality factors that have been determined; and determining the quality affecting factors based on the semiconductor products to be shipped that have been divided.

18. The method of claim 17, wherein the determining the critical quality factors comprises a feature set search operation based on a stepwise feature selection.

19. The method of claim 18, wherein the stepwise feature selection comprises executing a sequential forward selection and a sequential backward selection in parallel.

20. The method of claim 16, wherein the quality affecting factors that have been generated are transmitted to at least one customer server.

* * * * *